United States Patent
Guldi et al.

(10) Patent No.: US 7,228,193 B2
(45) Date of Patent: Jun. 5, 2007

(54) METHODS FOR DETECTING STRUCTURE DEPENDENT PROCESS DEFECTS

(75) Inventors: Richard L. Guldi, Dallas, TX (US); Jae H. Park, Plano, TX (US); Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 67 days.

(21) Appl. No.: 11/204,143

(22) Filed: Aug. 15, 2005

(65) Prior Publication Data
US 2007/0038325 A1 Feb. 15, 2007

(51) Int. Cl.
*G06F 19/00* (2006.01)
(52) U.S. Cl. .............................. 700/121; 716/4; 716/5; 716/19; 716/21; 700/110
(58) Field of Classification Search ................ 700/110, 700/121; 716/4, 5, 19, 21
See application file for complete search history.

(56) References Cited

U.S. PATENT DOCUMENTS

| | | | |
|---|---|---|---|
| 5,355,212 A * | 10/1994 | Wells et al. ............. | 356/237.4 |
| 5,991,699 A | 11/1999 | Kulkarni et al. | |
| 6,477,685 B1 * | 11/2002 | Lovelace .................. | 716/4 |
| 6,883,158 B1 * | 4/2005 | Sandstrom et al. .......... | 716/19 |
| 6,914,441 B2 | 7/2005 | Talbot et al. | |
| 2005/0004774 A1 * | 1/2005 | Volk et al. .................. | 702/108 |

OTHER PUBLICATIONS

"Performing automated process inspection of C2-open defects using review SEM" -Xu et al, Semiconductor Manufacturing INternational Corp. (SMIC); MicroMagazine.com, Jan. 2006.*

* cited by examiner

*Primary Examiner*—Michael D. Masinick
(74) *Attorney, Agent, or Firm*—Peter K. McLarty; W. James Brady, III; Frederick J. Telecky, Jr.

(57) ABSTRACT

Semiconductor devices formed on wafers are inspected using a master wafer. A subject wafer of a semiconductor design is provided. The subject wafer has dies wherein semiconductor devices of the semiconductor design are formed and at a stage of fabrication. A current layer of the subject wafer is scanned to obtain a scanned layer/image. A master wafer comprising individual wafer/layer maps is obtained. The scanned layer is compared with a corresponding layer map. Matching and non-matching defects are identified from repetitive defects within the corresponding layer map and defects within the scanned layer. The matching defects are reviewed to classify and or identify causality. The master wafer is then updated.

21 Claims, 13 Drawing Sheets

METHODS FOR DETECTING STRUCTURE DEPENDENT PROCESS DEFECTS

FIELD OF INVENTION

The present invention relates generally to semiconductor devices and more particularly to detecting feature dependent process defects.

BACKGROUND OF THE INVENTION

Semiconductor fabrication faces shrinking device dimensions and increasing process complexity. Devices of today are smaller and require more fabrication processes than devices of even a few years ago. Additionally, the shrinking dimensions require ever tighter tolerances for performance of the process employed in semiconductor fabrication. Semiconductor manufacturers generally recoup their manufacturing costs by selling their fabricated semiconductor devices. However, some semiconductor devices fail to meet operational requirements and are, therefore, unable to be sold. As a result, the manufacture does not recoup the manufacturing costs for the failed devices.

A critical statistic in semiconductor fabrication is yield, which is a percentage of devices fabricated that meet operational requirements. A goal of device fabrication process is to reach 100 percent yield, although this goal is not generally obtained. However, the closer to this goal and the higher the yield, the greater the profitability for manufacturer.

Semiconductor fabrication processes and the devices themselves are very sensitive to out of tolerance process conditions, mishandling, movement, temperature, humidity, and the like. As a result, defects in structures and layers present in semiconductor devices can occur. For example, inappropriate transferring of a boat containing wafers can result in defects formed on a number of devices located on those wafers.

Typical semiconductor devices can have relatively large numbers of defects present, such as 1,000 defects. However, fortunately, a large number of defects are not harmful, for example 880 out of the 1,000 defects. For example, hillock formations can occur in conductive layers within metallization layers and not substantially degrade device performance. But, other defects, such as unfilled trenches, are harmful, for example 20 out of the 1,000 defects, do degrade performance. Therefore, it is noted that classifying and identifying defects as harmful is important. Harmful defects can be analyzed and causing conditions identified. Corrections can then be made, such as altering process parameters and/or design layout, that mitigate occurrence of such defects in the future. However, properly classifying defects into harmful and harmless categories requires substantial time and expertise by trained personnel. This reduces the ability of semiconductor device manufactures to identify harmful defects and take proper corrective action to mitigate or prevent harmful defects from occurring in the future. As a result, yield values are unfortunately lowered.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor fabrication by employing previously identified defects, compiled as a master wafer, to select currently identified defects for further review. The master wafer comprises repetitive defects and spatial information for the repetitive defects. Furthermore, the master wafer can comprise additional information about the contained defects that facilitate selection, reviewing, and identifying causes of defects. The currently identified defects for a subject wafer are compared with the repetitive defects from the master wafer in order to identify matching or carryover defects which have similar properties to those contained within the master wafer. These matching defects have a higher probability than the non-matching defects to impact yield. Therefore, the matching defects are selected for further review.

In accordance with one aspect of the present invention, a method is provided for generating a master wafer that will be used to improve the effectiveness of defect inspection and review. The method comprises providing a semiconductor design having a plurality of layers. Layers of the plurality of layers are then selected for analysis. Defect histories for a plurality of wafers of the semiconductor design for the selected layers are combined. The defect histories are analyzed to identify repetitive defects. Subsequently, die maps for the selected layers are generated according to the identified repetitive defects. Wafer maps are then generated for the selected layers from the formed die maps. A master wafer is formed/generated by combining the generated wafer maps.

In accordance with another aspect of the present invention, semiconductor devices formed on wafers are inspected using a master wafer. A subject wafer of a semiconductor design is provided. The subject wafer has dies wherein semiconductor devices of the semiconductor design are formed.

A current layer of the subject wafer is scanned to obtain a scanned layer/image. A master wafer comprising individual wafer/layer maps is obtained. The scanned layer is compared with a corresponding layer map. Matching and non-matching defects are identified from repetitive defects within the corresponding layer map and defects within the scanned layer. The matching defects are reviewed to classify and or identify causality. The master wafer is then updated. Other methods and devices are disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
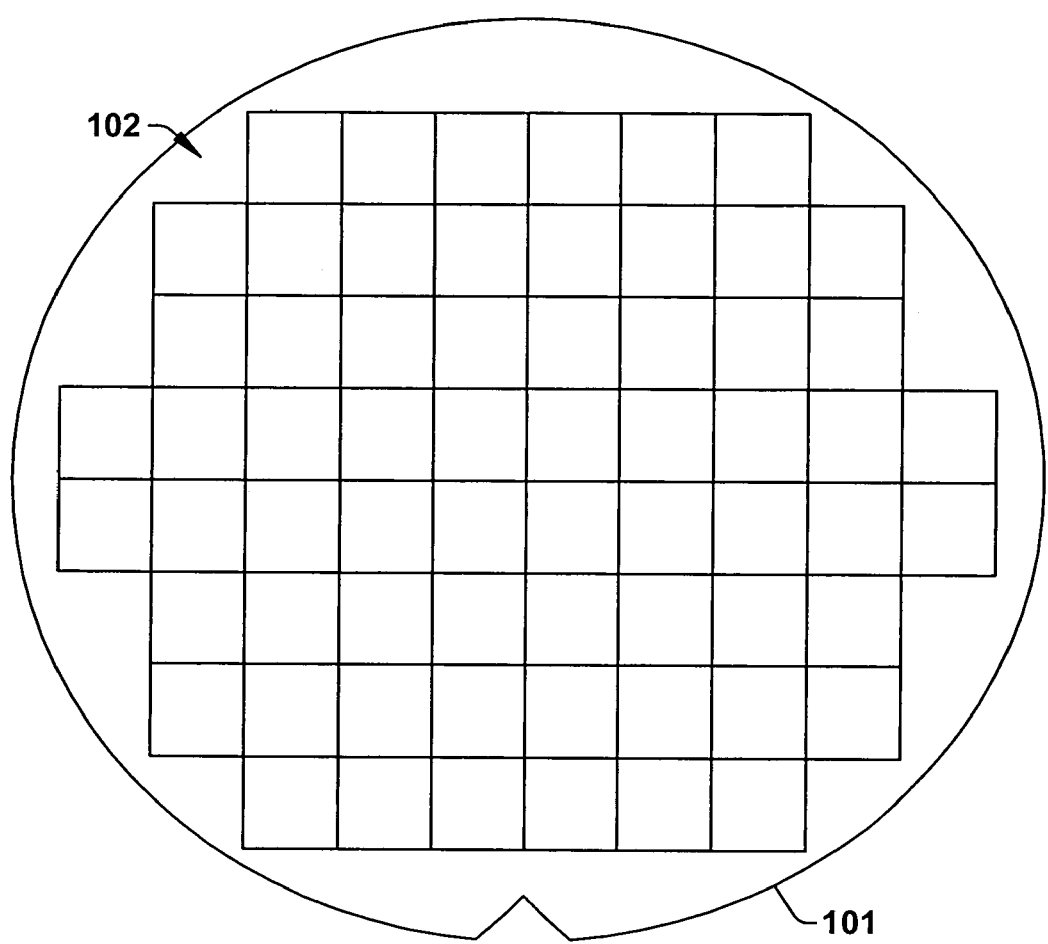
FIG. 1 is a top view of an exemplary semiconductor wafer.

One or more implementations of the present invention will now be described with reference to the attached drawings, wherein like reference numerals are used to refer to like elements throughout, and wherein the illustrated structures are not necessarily drawn to scale.

Unfortunately, defects do tend to occur during semiconductor fabrication. These defects typically result from problems encountered during fabrication, such as handling problems, process problems, and design layout problems. Some exemplary causes of defects include, for example, chemical smears, grain, haze, micros coring, wand marks, brush marks, rail marks, impact marks, hot spots, shower patterns, exposure shutter patterns, doughnut patterns, poorly or unevenly developed layers on the dies, over etching, under etching, thermal variations, and the like.

Defects from a common cause typically have some common relationship with each other. For example, defects may have similar or identical spatial locations within the dies of a wafer. These defects are referred to as spatial repeaters or spatially repetitive defects. Other defects may share a similar structure, but do not share similar spatial locations within the dies. Such defects are referred to as non-spatial repeaters or structurally repetitive defects. Conventionally, defects are analyzed manually by a technician or operator. An inspection mechanism typically identifies a relatively large number of defects for a die or wafer. Generally, reviewing all of the identified defects is not feasible, so the operator chooses which defects to review, often by using a computer software program. However, the selection may miss repetitive defects that share a similar causality and over includes non-harmful or non-yield impacting defects. Then, the operator employs a device, such as a scanning electron microscope, to further analyze the selected defects. During this analysis, the operator attempts to classify the reviewed defects.

The present invention employs a master wafer that comprises previously identified repeaters, including spatially and structurally repetitive defects. The master wafer is employed to automatically identify matching defects for a subject semiconductor wafer. The identified matching defects are then typically further reviewed to identify their cause. The identified matching defects can often share a common cause with the repeaters from the master wafer and are also more likely to result from structurally dependent fabrication problems than non-matching defects. After review, a corrective action can be performed to overcome any identified causes and mitigate future occurrences of the identified matching defects.

FIG. 1 is a top view of an exemplary semiconductor wafer 101. This view is exemplary in nature and is provided to facilitate understanding of the present invention.

The wafer 101 is comprised of a semiconductor material, such as silicon, and is substantially circular in nature. The wafer 101 is typically formed from a single grown crystal by slicing a large crystal of the semiconductor material. The wafer 101 comprises a plurality of individual die 102, wherein semiconductor devices are fabricated. Scribe lines are present and serve to separate the dies 102 from one another so each die 102 is a discrete device.

The dies 102 have semiconductor devices, such as processors, memory devices, and the like, formed and/or fabricated therein. The wafer 101 can be at one of a variety of stages of fabrication. Initially, the wafer 101 is simply a substrate or semiconductor material, but as semiconductor fabrication continues, layers and structures are formed on and within the dies 102.

Typically, semiconductor devices formed on the dies 102 of the wafer 101 are of a particular type and/or design. During fabrication, processing errors and/or defects can be identified. These errors and defects can hamper or degrade operation of these semiconductor devices and even prevent their later use, if they fail to meet operational requirements.

After fabrication, the dies 102, if they meet requirements, are separated into the individual dies or chips and then incorporated into a protective package. The fraction of the dies that meets the operational requirements comprises the yield of the wafer. Typically, the yield is express as a percentage of acceptable dies divided by the total number of dies.

Figure 2A:
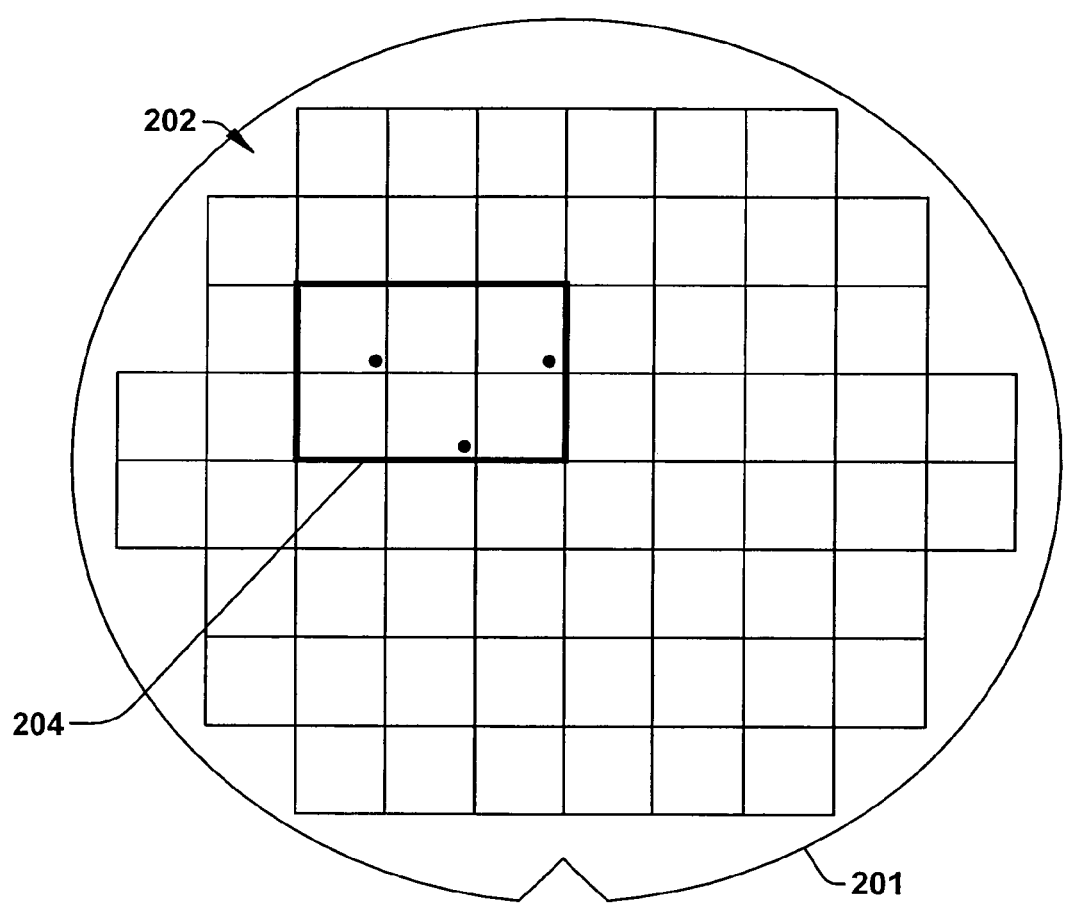
FIG. 2A is a top view of another exemplary semiconductor wafer that demonstrates spatially repetitive defects.

FIG. 2A is a top view of another exemplary semiconductor wafer 201 that demonstrates spatially repetitive defects. This wafer 201 is similar to that of the wafer 101 of FIG. 1. The wafer 201 similarly includes semiconductor dies 202 wherein discrete semiconductor devices are fabricated.

At a stage of fabrication, defect detection is performed. One suitable mechanism is optical inspection, wherein optical light is directed toward a target die and reflected back to a sensor, which generates an optical image for the target die. This optical image is compared with similarly obtained images for adjacent dies, such as to the left and the right. The comparison is typically a pixel by pixel comparison that identifies variations, which are deemed defects. Threshold values, such as a number of pixel variations, may be employed to more properly identify defects.

Many defects identified during defect detection are harmless or innocuous. For example, hillock formations on metallization layers can be relatively harmless. For such innocuous defects, corrective action is generally not required. However, other defects are harmful to device performance and operation and do require corrective action. For example, unfilled or corroded vias can require semiconductor process alterations and/or design layout alterations in order to mitigate such defects in the future.

One conventional technique for identifying probably harmful defects is by identifying spatially repetitive defects, such as those shown at 204 of FIG. 2. These types of defects occur at specific locations within the dies 202 and, as a result, are repetitive errors.

Figure 2B:
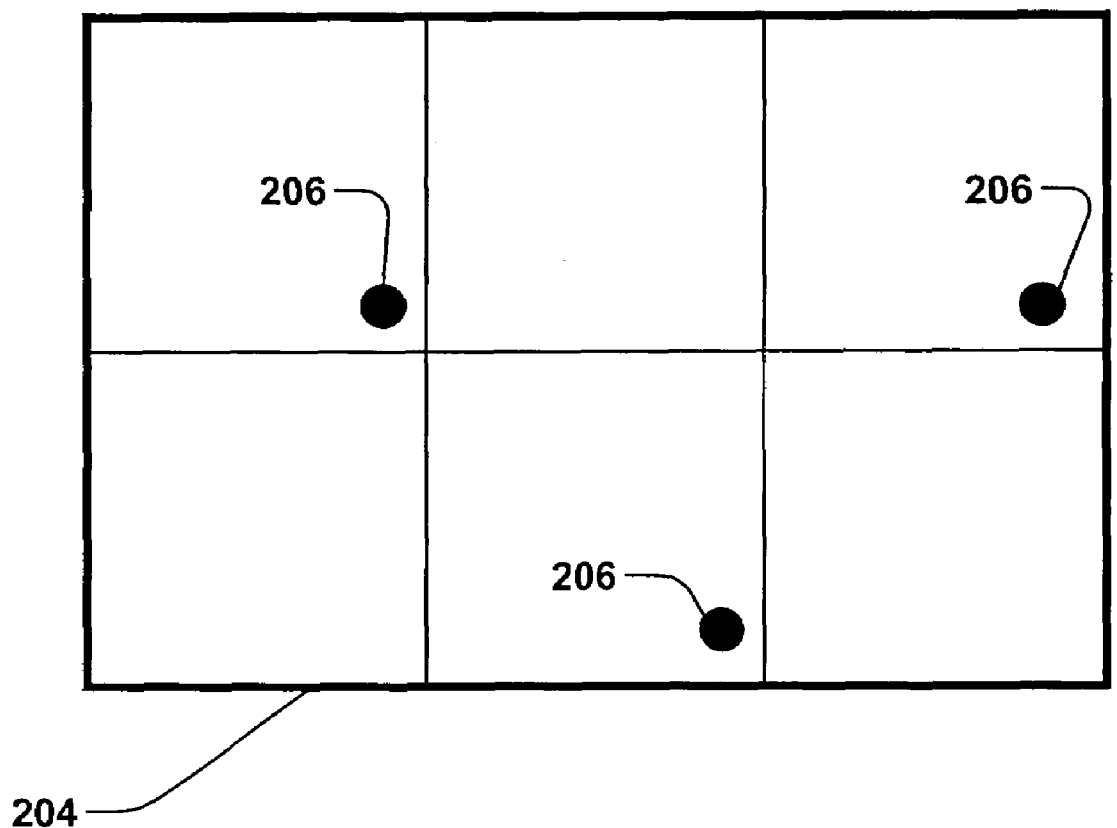
FIG. 2B is a close up view of a portion of an exemplary semiconductor wafer.

FIG. 2B is a close up view of the portion 204 of dies of the wafer 201. Here, the spatially repetitive defects 206 are shown with their spatial location within the dies 202. Their similar spatial locations increases the probability that these defects 206 are structurally dependent process and/or design related. As a result, the defects chosen for scanning electron microscope (SEM) review are weighted to include a large fraction of the structurally repeating defects 206 while only a small fraction of other defects are reviewed. This strategy increases the opportunity to see and catalog problems related to structurally dependent process or design defects.

Figure 3A:
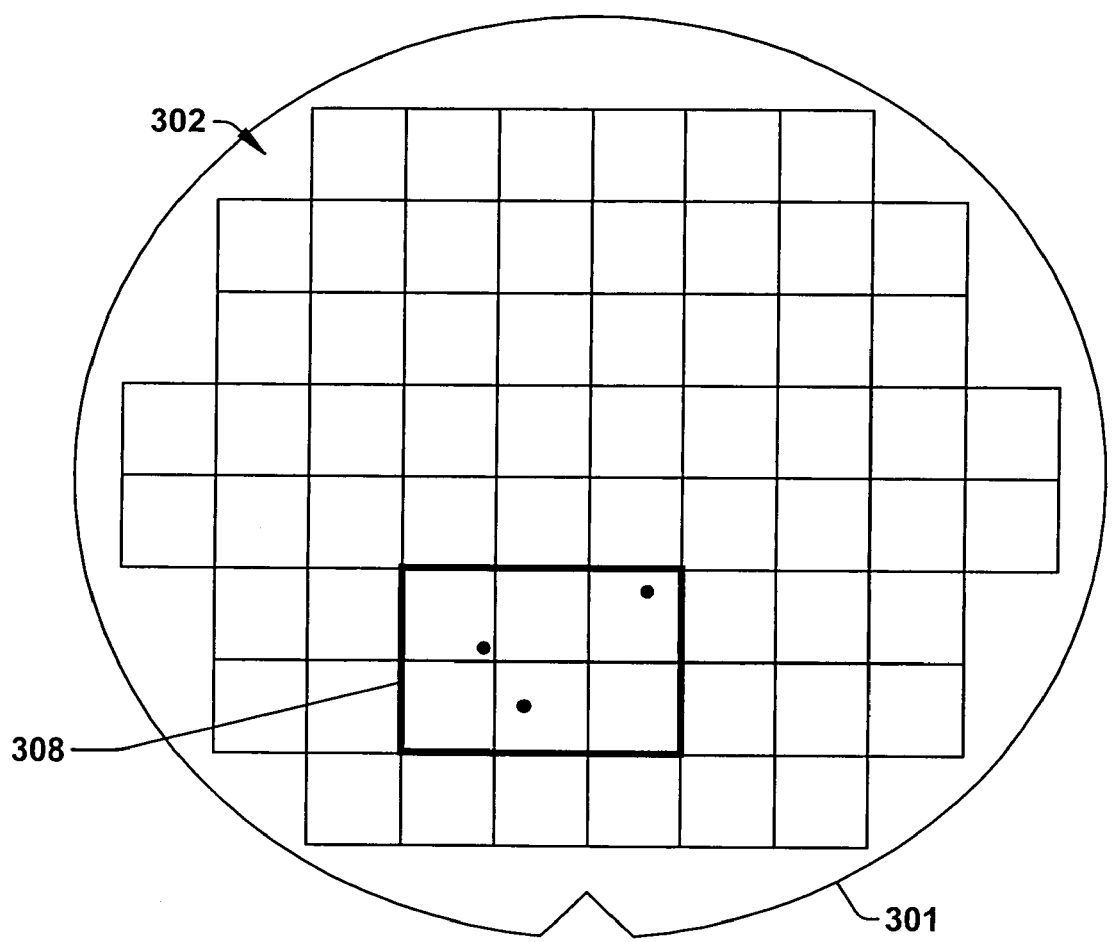
FIG. 3A is a top view of another exemplary semiconductor wafer that demonstrates structurally repetitive defects.

FIG. 3A is a top view of yet another exemplary semiconductor wafer 301 that demonstrates structurally repetitive defects. This wafer 301 is similar to that of the wafer 101 of FIG. 1 and the wafer 201 of FIG. 2. The wafer 301 similarly includes semiconductor dies 302 wherein discrete semiconductor devices are fabricated. The defects in FIG. 3A differ from those in FIG. 2A in that they are not spatially repetitive, but each defect exhibits the same structural characteristics.

At a stage of fabrication, defect detection is performed as described above. Typically, a comparison or analysis of a current, subject die is optically compared with adjacent dies. The comparison is typically a pixel by pixel comparison that identifies variations, which are deemed defects.

In FIGS. 2A and 2B, spatially repetitive defects were identified by their recurring spatial locations within the dies. However, some defects, such as unfilled vias, are repetitive in structures, such as unfilled vias having a particular physical arrangement, but may be non-repetitive spatially.

With respect of FIG. 3A, the defect detection has identified a number of defects within a portion 308 of the wafer 301. These defects are not spatially repetitive, but may be structurally repetitive, in this example.

Figure 3B:
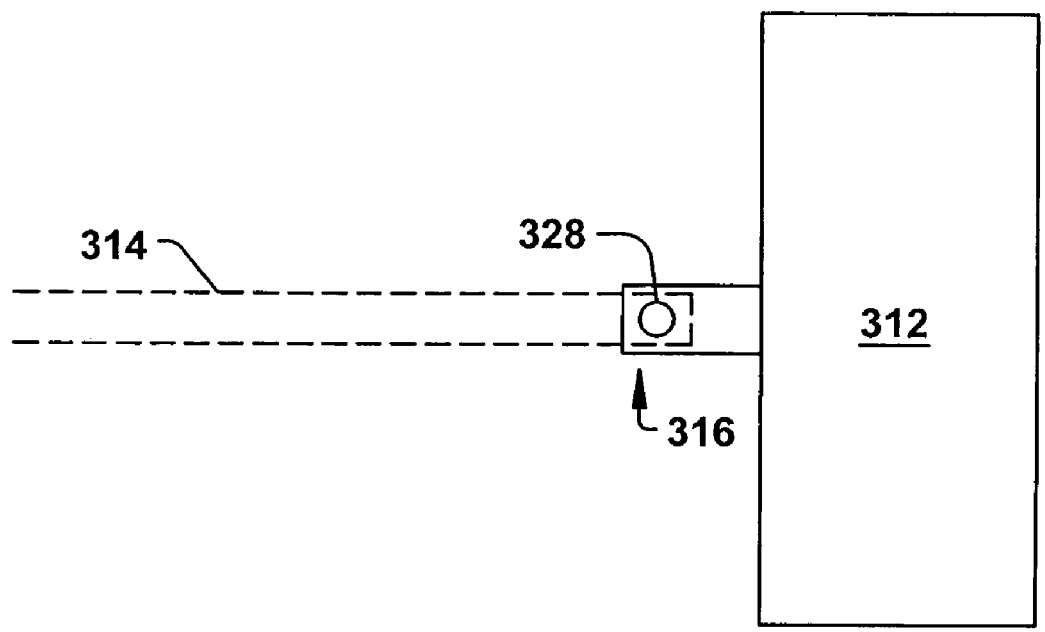
FIG. 3B is a top view of exemplary structurally repetitive defects.
Figure 3B:
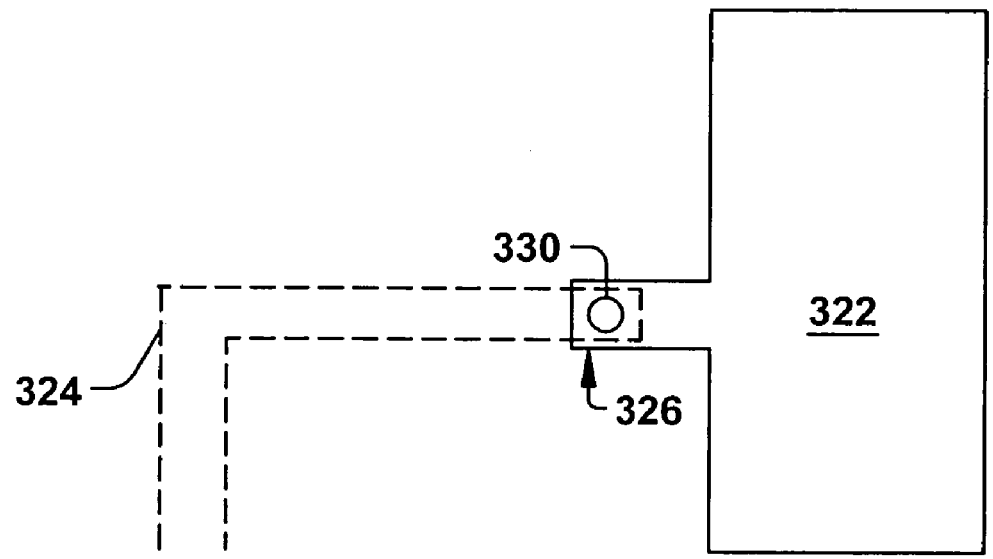

FIG. 3B is provided to further illustrate structurally repetitive defects. Here, a top view of various portions of the wafer 301 is shown. A first top level metal conductor 312 is connected to a first lower metal conductor 314 through a first via hole 316. However, a first structural defect 328 is present, which prevents proper electrical connection between the first top metal conductor 312 and the first lower level metal conductor 314. The defect 328, in this example, is a faulty via, such as a missing or recessed via, at the end of a via chain near a metal pad. Similarly, a second top metal conductor 322 is connected to a second lower level metal conductor 324 through a second via hole 326. However, a second structural defect 330 is present, which also prevents proper electrical connection between the second top metal conductor 322 and the second lower level metal conductor 324. The defect 330 is another example of a faulty via at the end of a via chain near a metal pad. Thus, the structurally repetitive defects 328 and 330 have similar structural properties, but, in this example, are not spatially repetitive. As a result, conventional defect detection mechanisms can fail to identify such defects.

As stated above, many defects identified during defect detection are harmless or innocuous and do not require corrective action, such as design and/or fabrication process alterations. However, other defects are harmful to device performance and operation and do require corrective action. For example, unfilled or corroded vias, described above, can require semiconductor process alterations and/or design layout alterations in order to mitigate such defects in the future.

Figure 3C:
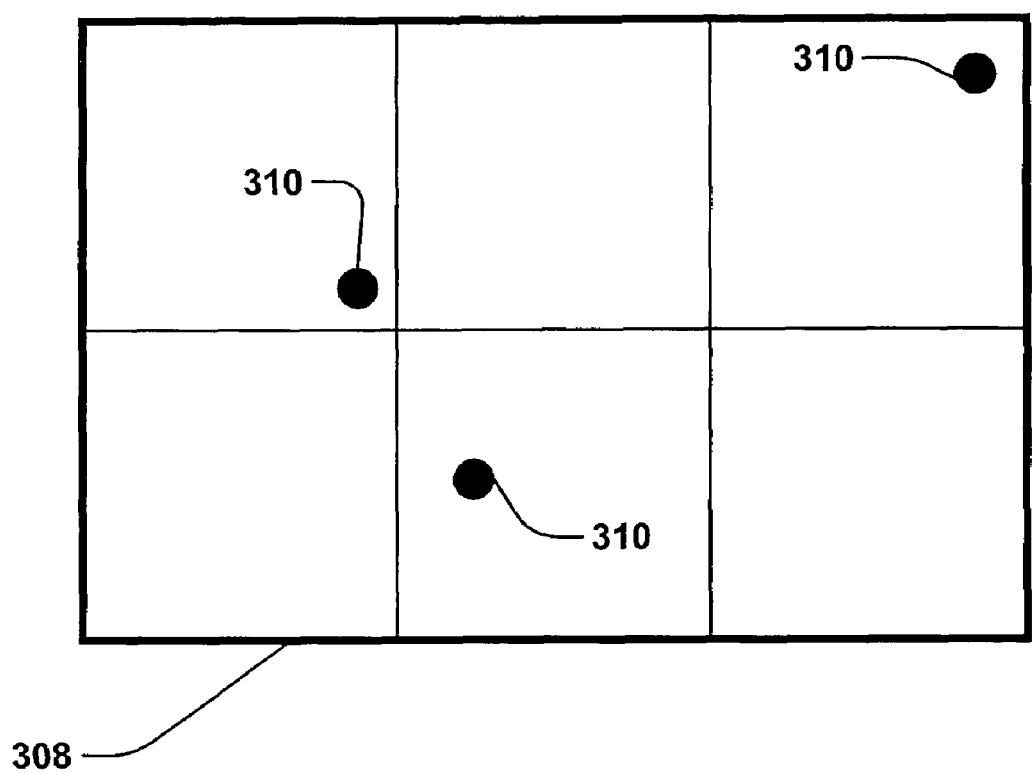
FIG. 3C is a close up view of a portion of an exemplary semiconductor wafer.

FIG. 3C is a close up view of a portion 308 of dies 302 of the wafer 301. Here, the structurally repetitive defects 310 are shown with their spatial location within the dies 302. The structurally repetitive defects 310 are similar structure defects, such as corroded vias in a particular geometric pattern that require further review and possibly design layout and/or semiconductor fabrication process alteration, as described above. FIG. 3B describes some exemplary structural defects 328 and 330. However, the structurally repetitive defects 310, in this example, are not spatially repetitive. As a result, conventional mechanisms that only identify spatially repetitive defects for further review may miss defects, such as the structurally repetitive defects 310 for further analysis or review. As a result, these defects 310 are typically not selected for review, which prevents corrective action from being taken and can lower device yield.

Figure 4:
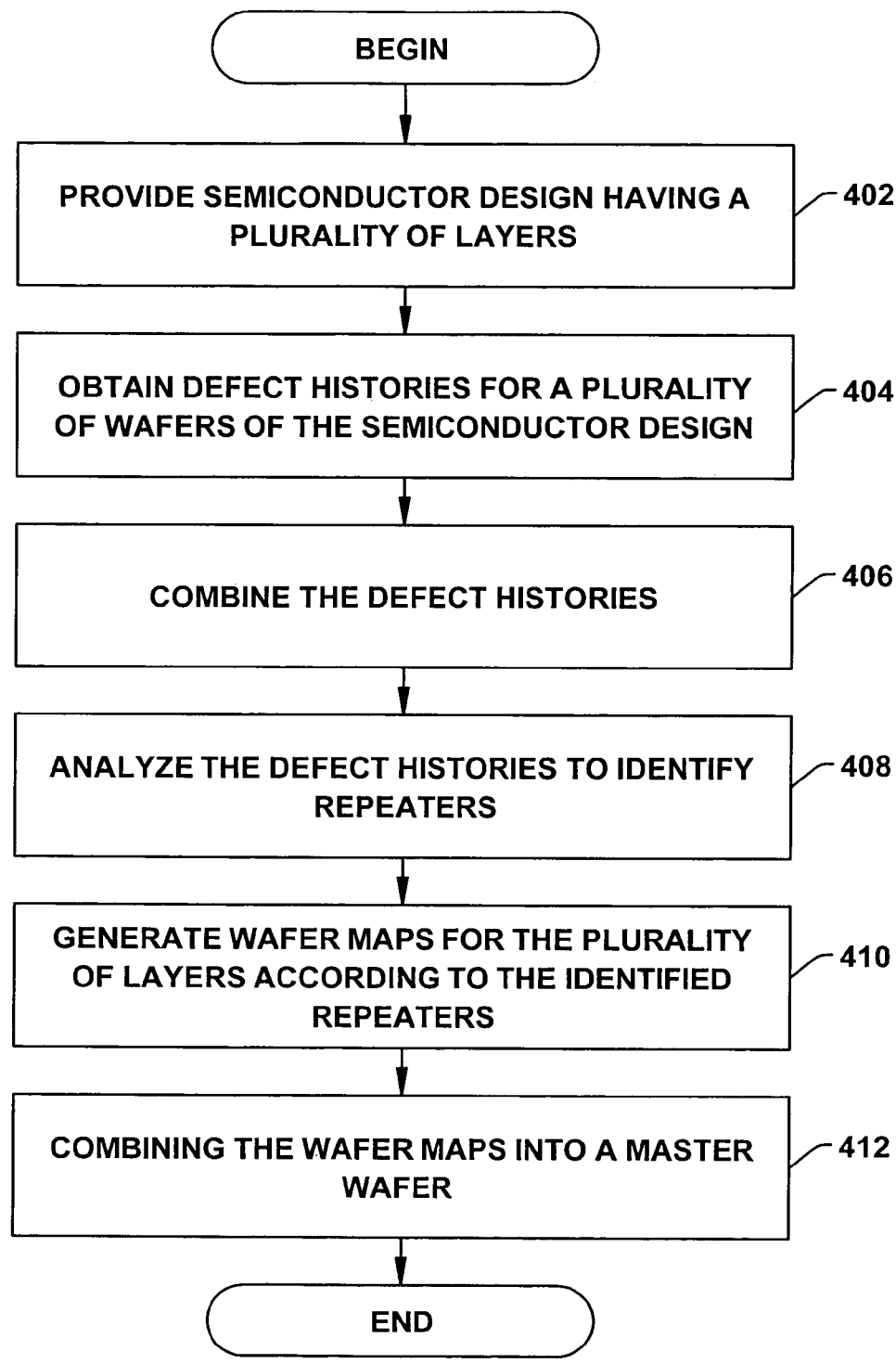
FIG. 4 is a flow diagram illustrating a method of generating a master wafer in accordance with an aspect of the present invention.

FIG. 4 is a flow diagram illustrating a method 400 of generating a master wafer or master wafer map that can be employed in identifying spatially and structurally repetitive defects in accordance with an aspect of the present invention. While, for purposes of simplicity of explanation, the method 400 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 400 begins at block 402 wherein a semiconductor design or type is provided. The semiconductor design is for a particular semiconductor device, such as a memory device, processor, and the like. The semiconductor design includes a plurality of layers employed in fabrication of the particular semiconductor device. For example, the plurality of layers can comprise metallization layers, gate electrode layers, dielectric layers, source/drain regions, well regions, and the like. The plurality of layers are intended to be formed within and/or over a semiconductor body.

Defect histories are obtained for tested or inspected wafers fabricated according to the provided semiconductor design at block 404. The defect histories include, at a minimum, spatial location within individual die and/or within wafers formed thereon and the stage of processing or process layer where the defect was identified. Additionally, the defect histories can comprise additional details including, but not limited to, defect size, defect shape, defect classification, causality, and the like.

The defect histories are typically generated using a defect detection mechanism, such as optical inspection or electrical inspection. The defect detection mechanism identifies observed or measured differences between an expected product and the actual product either in appearance or performance. The defect detection mechanism provides the identified defects along with spatial location and the additional details mentioned above.

For an exemplary optical inspection, optical light is directed toward a target die and reflected back to a sensor, which generates an optical image for the target die. Similar images are obtained for adjacent dies or other dies within the wafer. The optical image of the target die is compared with optical images for the adjacent dies to identify defects. In one example, the comparison is a pixel by pixel comparison.

The defect histories are obtained for selected layers of the plurality of layers. Typically, the selected layers are the layers after critical fabrication processes have been performed, such as etches, metallization layer formation, and the like.

The obtained defect histories are combined into a single set or database at block 406. The combined defect histories can be from any suitable number of tested wafer (e.g., 10, 50, 1000, and the like). Thereafter, the combined defect histories are analyzed at block 408 to identify spatially and structurally repetitive defects. The structurally repetitive defects are non-spatially repetitive for inspections of one wafer, but they become (spatially) repetitive when multiple wafer defect histories are combined. The structurally repetitive defects can vary spatially within individual die.

Individual wafer maps, also referred to as layer maps, are generated according to the identified defects at block 410. The wafer maps each correspond to a layer of the provided semiconductor design. The wafer maps comprise a number of dies or die maps that correspond to the dies present in the tested wafers, which is typically the same number. The die maps each include detected repetitive defects for the corresponding layer of the semiconductor design. In one example, a die map is formed by combining a stacked die map for a current wafer defect history with a die map from previous defect histories for a selected layer. Some examples of suitable die maps and wafer maps are provided below.

The individual wafer maps are combined into a master wafer at block 412. The master wafer includes the identified repeaters within the wafer maps. The master wafer can then be employed and further developed with additional testing and/or inspections of wafers of the provided semiconductor design.

In addition to the location information, the master wafer can also include additional information related to the repeaters. For example, the master wafer can include number of occurrences, frequency of occurrence, probable classification, severity, fabrication conditions, and the like for the repeaters. The number of occurrences is the number of times that defect/repeater has been identified in the defect histories. The frequency of occurrence is the number of times that defect/repeater has been identified in the defect histories divided by the total number of dies analyzed from the defect histories. The probable classification can include one or more possible classifications of the repeaters and is typically a result of reviews performed on the repeaters. The severity indicates how severe the occurrence is of this defect/repeater. The fabrication conditions include process parameters employed in forming the various layers, which can be beneficial to identify whether changed process conditions reduce or increase the occurrence of various repeaters.

Additionally, the master wafer can undergo additional analysis to determine or identify design layout and/or process corrections that can mitigate future occurrence of some of the repeaters. For example, a high number of occurrences for a particular repeater, such as beyond a threshold value, can indicate a serious error/defect and require correction and/or analysis.

Figure 5A:
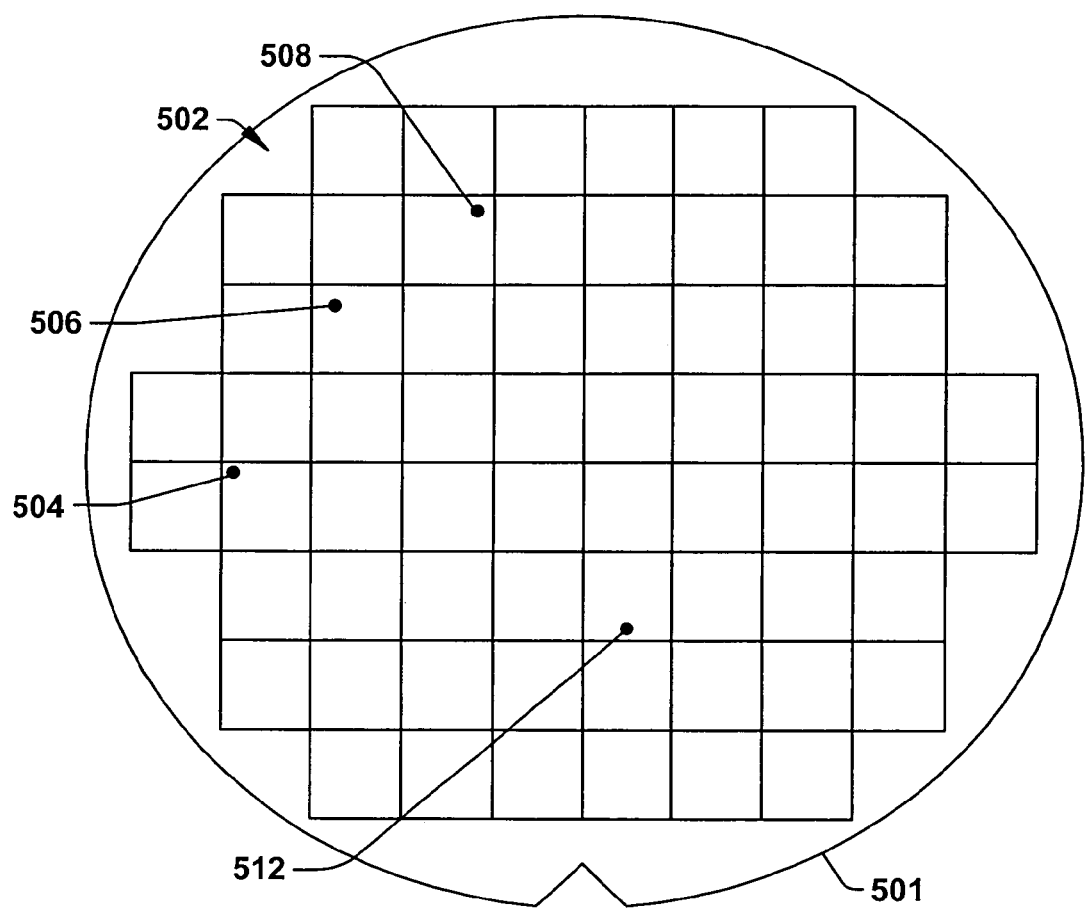
FIG. 5A is a view of an exemplary defect history for an exemplary analyzed wafer in accordance with an aspect of the present invention.
Figure 5B:
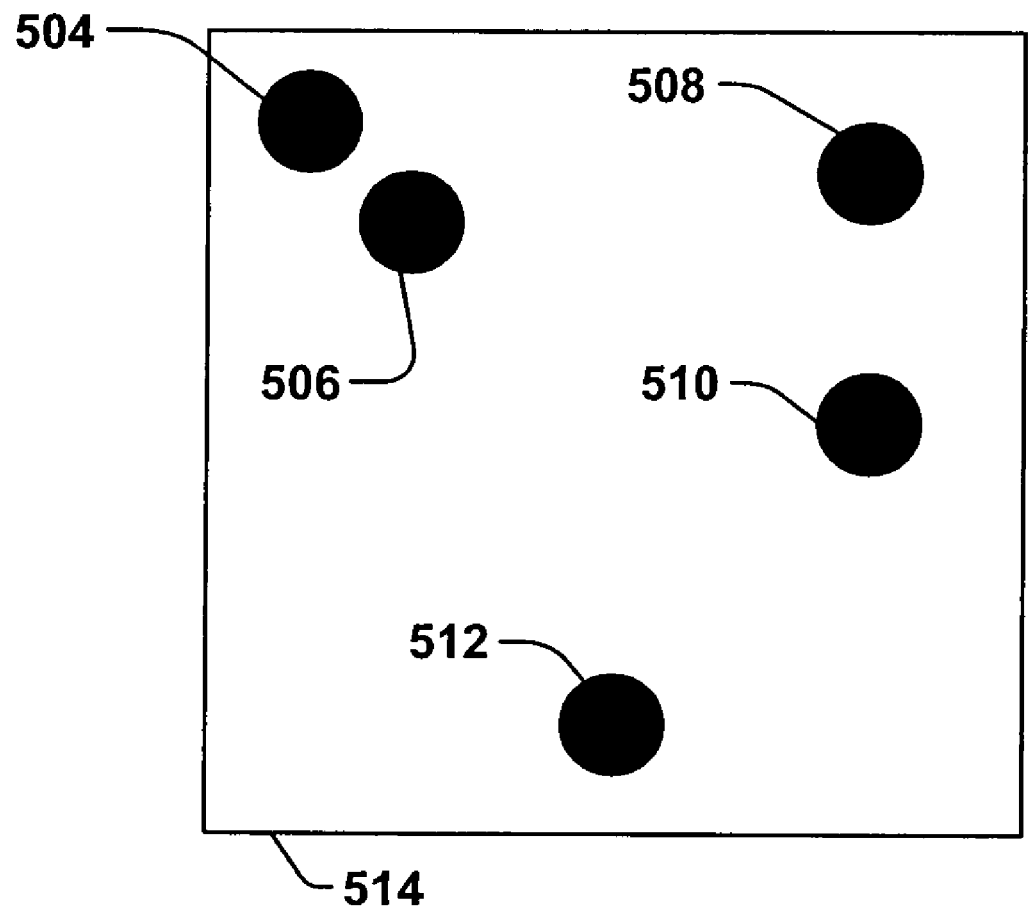
FIG. 5B is a view of an exemplary die map in accordance with an aspect of the present invention.
Figure 5C:
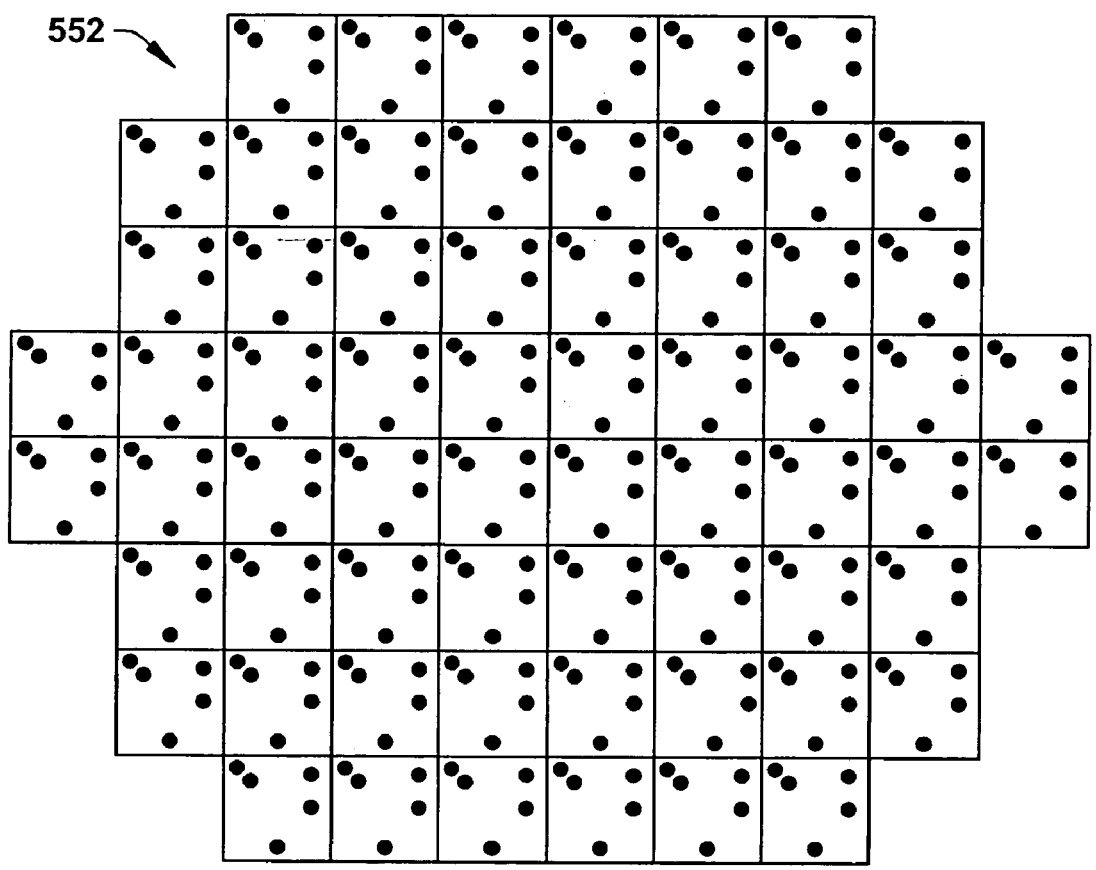
FIG. 5C is a view of an exemplary wafer map in accordance with an aspect of the present invention.

FIGS. 5A to 5C, below, are provided to more fully illustrate the method 400 of FIG. 4. The FIGS. 5A to 5C are exemplary in nature and further describe and illustrate generating a master wafer.

FIG. 5A is a view of an exemplary defect history for an exemplary analyzed wafer 501 in accordance with an aspect of the present invention. The following description illustrates the exemplary defect history and possible mechanisms employed to obtain it. The defect history is for a particular layer or stage of processing, such as metallization, for a semiconductor design. It is noted that any number of defect histories for other layers and other wafers can be employed to generate a master wafer, as described in the method 400 of FIG. 4.

The analyzed wafer 501 is comprised of a semiconductor material, such as silicon, and is substantially circular in nature. The wafer 501 includes semiconductor dies 502 wherein semiconductor devices are formed. Scribe lines are present and serve to separate the dies 502 from one another.

At the time of obtaining the defect history, the semiconductor devices formed on the dies 502 are at a particular stage of fabrication, which is typically a critical stage of fabrication. For example, the stage of fabrication may be immediately after an etch process, a chemical mechanical planarization process, and the like.

A suitable defect detection mechanism is employed to identify a number of defects at locations on the wafer as shown in FIG. 5A. The defect detection mechanism can, in one example, be an as optical inspection or electrical inspection. The defect detection mechanism identifies observed or measured differences between an expected product and the actual product either in appearance or performance. The defect detection mechanism provides the identified defects along with spatial location and, optionally, additional details. An example of a suitable defect detection mechanism is optical inspection, wherein optical light is directed toward a target die and reflected back to a sensor, which generates an optical image for the target die. This optical image is compared with similarly obtained images for adjacent dies, such as to the left and the right.

The defect detection mechanism, in this example, has identified defects 504, 506, 508, and 512 as shown in FIG. 5A at the various locations. The defect history contains spatial information for the identified defects and can include additional information.

FIG. 5B is a view of an exemplary die map 514 in accordance with an aspect of the present invention in which cumulative die maps are combined together to make a composite die map showing the defect locations on multiple wafers from different production batches all combined into a single die. The exemplary die map 514 represents a typical die from the wafer 501 with the individual wafer maps stacked together so that all defects from one or more entire wafers are mapped into a single die, retaining their spatial position within the die. The exemplary die map 514 has a similar shape as the dies 502. The exemplary die map 514 is created at least partially from the defect history shown and described with respect to FIG. 5A. After the defect mechanism has identified the defects 504, 506, 508, and 512, they are overlaid onto and added to the single exemplary die map 514. In this example, a previously identified defect 510 was included, so the defects present within the die map 514 now include the defects 504, 506, 508, 510, and 512. However, if one or more defects were previously present on the cumulative die map 514, they would also be shown. Additional information can also be obtained and maintained for the defects of the die map 514. For example, the number or multiples of defects at defect locations can be maintained, process parameters, and the like.

FIG. 5C is a view of an exemplary wafer map or layer map 552 in accordance with an aspect of the present invention. The single die map 514 from FIG. 5B is replicated to cover die locations present in a wafer, thereby forming the exemplary wafer map 552. The exemplary wafer map 552 can then be combined with other wafer maps (not shown) that correspond to other layers of a semiconductor device design in order to form a master wafer or master wafer map.

FIGS. 5A to 5C illustrate a single pass through in forming the master wafer 552. Multiple passes through different layers can and typically are performed to more fully form and define the master wafer 552. The die map 514 and wafer map 552 can be further developed as additional defect histories are analyzed. It is noted that the FIGS. 5A to 5C are exemplary in nature and that the present invention is not limited to the views shown therein.

Figure 6:
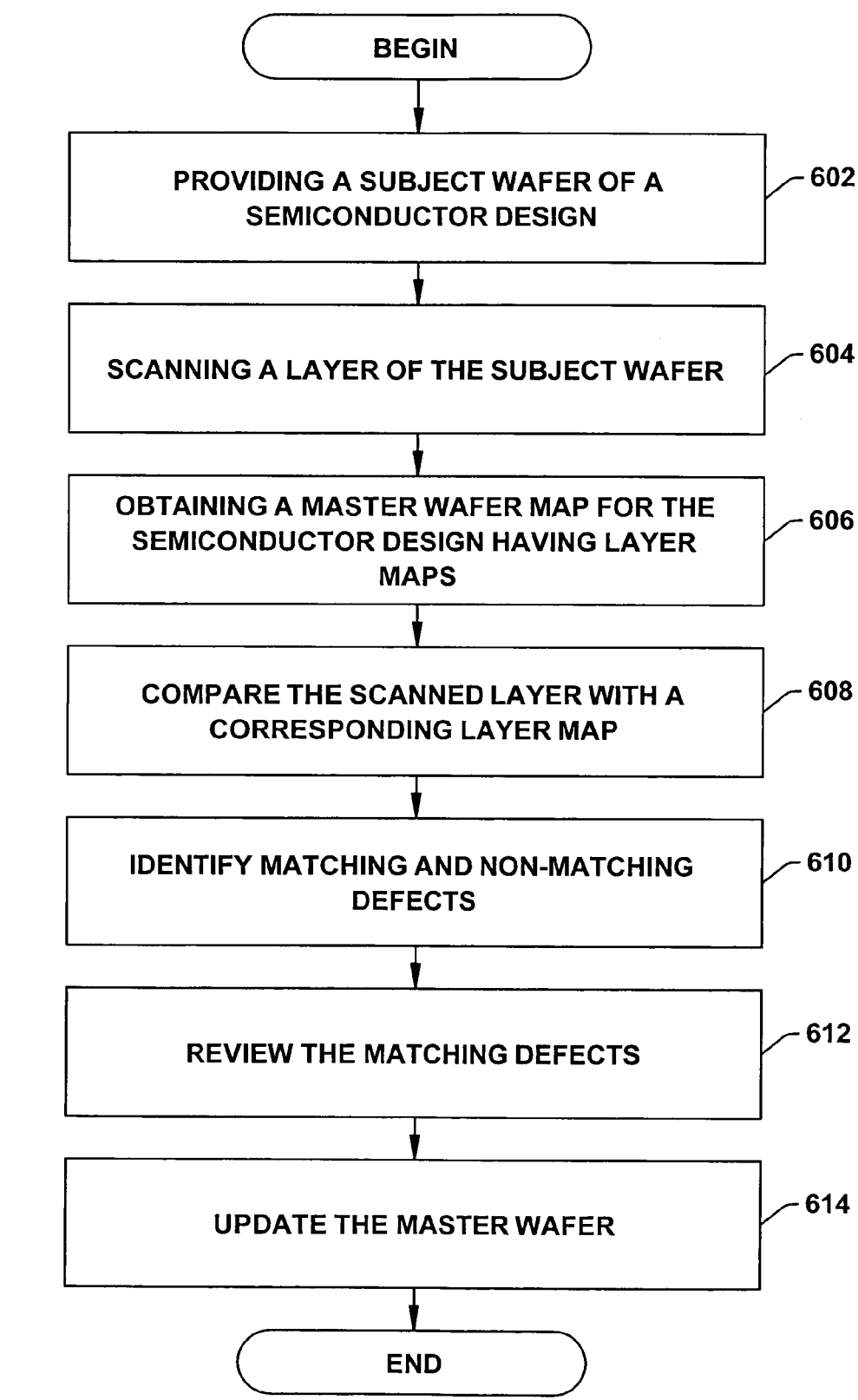
FIG. 6 is a flow diagram illustrating a method for identifying repetitive defects in accordance with an aspect of the present invention.

FIG. 6 is a flow diagram illustrating a method 600 for identifying repetitive defects in accordance with an aspect of the present invention. The method 600 employs a master wafer comprised of wafer or layer maps that indicate previous defect locations. By so doing, the method 600 can select spatially and structurally repetitive defects for further review. The repetitive defects, also referred to as repeaters, have a relatively high probability for being design layout and/or semiconductor fabrication process related defects.

The method 600 is depicted and as executing serially, however it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 600 begins at block 602 wherein a subject wafer of a semiconductor design is provided. The subject wafer is comprised of a semiconductor material and has semiconductor dies defined and formed thereon. The dies are physically separated by scribe lines, such as shown supra. The semiconductor dies have semiconductor devices formed thereon according to the semiconductor design. The semiconductor devices are at a particular stage of fabrication, such as, for example, metallization. The semiconductor design can include, for example, memory devices, processors, logic devices, and the like.

A current layer or exposed layer of the subject wafer is scanned by a suitable scanning or defect detection mechanism at block 604 to obtain a defect scan of the current layer. The scanning identifies defects of the current layer and their locations. It is appreciated that a number of these defects can be innocuous defects that do not degrade or hamper device operation. The scanning is typically performed after a critical fabrication process, such as an etch or CMP process for a metallization layer.

Any suitable defect detection mechanism can be employed, such as optical inspection, electrical inspection, and the like. The defect detection mechanism identifies observed or measured differences between an expected product and the actual product either in appearance or performance. In one example, an optical inspection based defect detection mechanism obtains optical scans of a current die and compares it with optical scans of one or more adjacent dies. Detected variations are identified as defects and the process continues through all the dies on the wafer. The defect detection mechanism provides the identified defects along with spatial location information and may also include additional information, such as process parameters, handling conditions, and the like.

A master wafer map is obtained for the semiconductor design at block 606 that includes repetitive defects also referred to as repeaters. The master wafer map includes a plurality of wafer or layer maps for the semiconductor design and includes a particular or current wafer map for the current layer.

Generally, the master wafer map includes previously identified repetitive defects/repeaters along with information about the previously identified defects. The information includes spatial information and can also include other additional information, such as number of occurrences, frequency of occurrence, probable classification, causality, severity or yield impact, fabrication conditions, and the like.

The scanned layer is compared with the corresponding or current wafer map at block 608. The wafer map has one or more repeaters at various locations that indicate occurrences of one or more previously identified defects on previously scanned or tested wafers comprising semiconductors of the semiconductor design for the currently scanned layer.

Matching and non-matching defects are identified at block 610 from this comparison by at least employing spatial information. The matching defects, also referred to as carry over defects, are considered to be spatially or structurally repeating defects and to have a relatively higher probability of being process or design related defects. These defects are often called carry over defects because they occur in the same physical location on a die as defects found in previous inspections of other wafers. In one example, images of the wafer map and the defect scan are compared pixel by pixel to identify matches.

Continuing at block 612, the matching defects are reviewed by a suitable mechanism. The review mechanism, such as a scanning electron microscope (SEM), other type of microscope, or other sampling rules, attempts to further analyze the defect and determine the type or classification, and causality of the defect. The matched defects share at least some characteristics with the repeaters with which they match. As a result, the matched defects can share a similar cause and/or yield impact. Therefore, a corrective action may be able to be performed that mitigates future occurrences of similar defects. The corrective action can include design layout modifications, alteration of process parameters, improved handling procedures, and the like.

It is noted that conventional mechanisms can fail to identify or select some of these matched defects for review because of the large number of non-repeaters compared to the number of repeaters. As a result, low level low occurrence repeater defects, in some cases, would not be reviewed by the conventional methods that do not perform SEM review on a disproportionate share of the repetitive defects. Additionally, the review mechanism can also determine or estimate an impact on yield. If the yield impact is determined or estimated to be relatively low, further review can be avoided. Otherwise, if the yield impact is determined or estimated to be relatively high, further review can be performed.

A number of suitable review mechanisms can be employed in accordance with the method 600 and the present invention. In one example, a wafer image analysis system is employed to analyze and classify the matching defects according to shape and background. The system then groups the images into categories of similar shapes with the same background. Further targeted review can then be performed on some or all of the images within the particular groups.

In another example, the semiconductor design is analyzed for an immediately underlying layer and an immediately overlying layer with respect to the current layer. The analysis occurs at each defect location and identifies structural similarities in the physical layout or background of the layout. Targeted defect review and classifications can then be performed on the matching defects that have similar features in the overlying and underlying layers. For example, matching defects that are on a gate electrode of specific structural design can be targeted for further review.

In yet another example, feature anomalies related to the identified matching defects can be cataloged into a database and then employed to identify similar features in different layers and/or different devices (designs).

In another example, probability statistics are compiled as part of the master wafer that predict the occurrence at identical areas. Then, high probability locations for severe defects can be targeted for review or more extensive review.

The master wafer is updated at block 614 with the additional defects identified for the scanned layer. The identified defects are overlain on the die map to update the die map with the additional defects/repeaters. Then, the die map is replicated to cover the wafer map for the master wafer. Additional information for the repeaters can also be added or updated, such as, for example, number of occurrences, frequency of occurrence, probable classification, severity, fabrication conditions, and the like. It is noted that alternate aspects of the invention can omit updating the master wafer at block 614 and still be in accordance with the present invention.

The method 600 can be repeated for additionally layers of the subject wafer and, additionally, for other wafers having semiconductor devices formed thereon according to the semiconductor design.

Figure 7A:
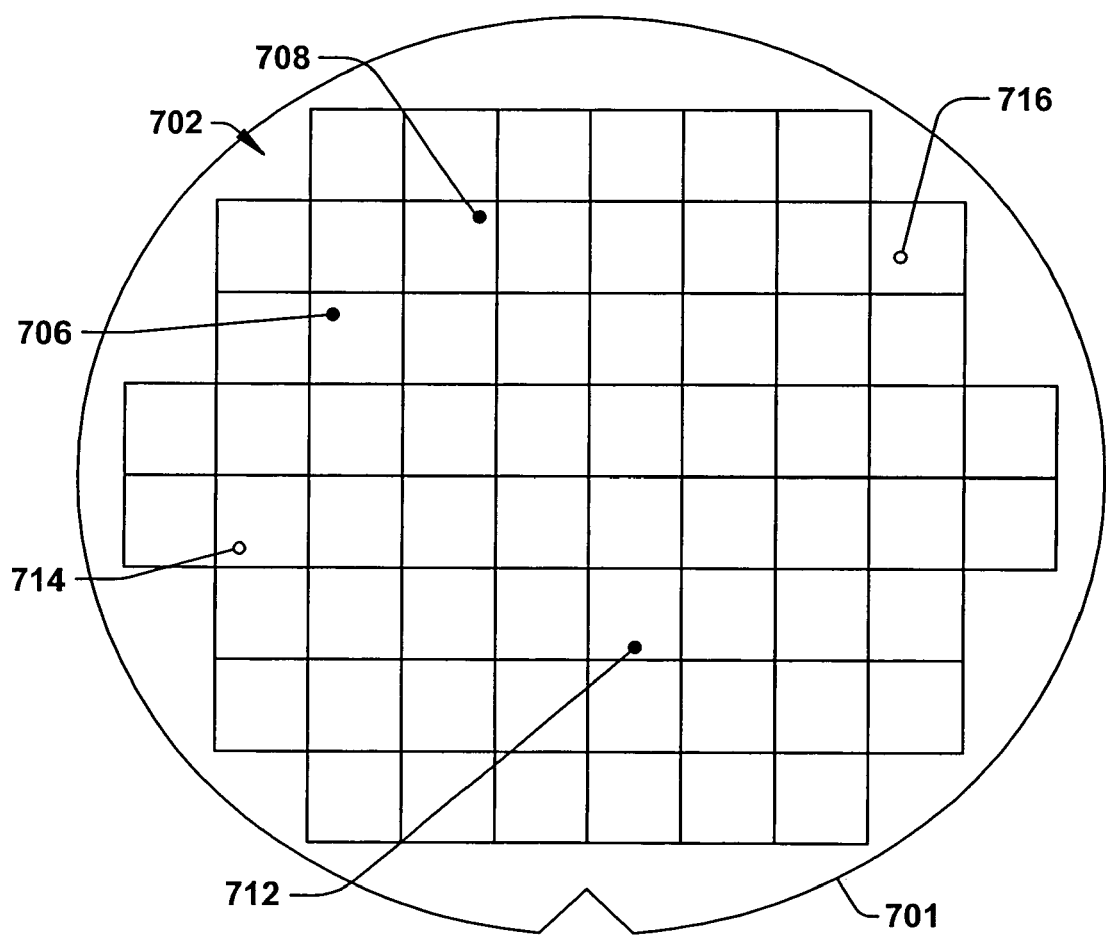
FIG. 7A is a top view of a scan of a current layer of a subject wafer in accordance with an aspect of the present invention.
Figure 7B:
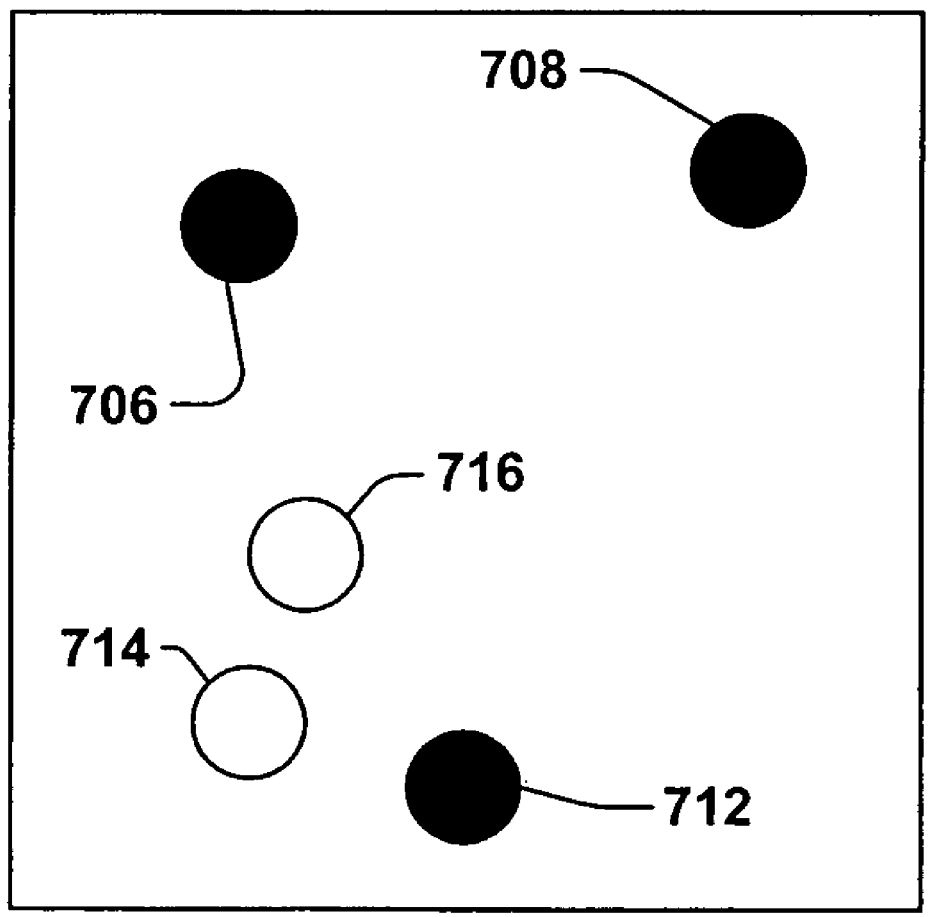
FIG. 7B is a view illustrating matching defects with an exemplary wafer map in accordance with an aspect of the present invention.

FIGS. 7A and 7B, described below, are provided to more fully illustrate the method 600 of FIG. 6. The FIGS. 7A and 7B are exemplary in nature and further describe and illustrate identifying repetitive defects in accordance with an aspect of the present invention.

FIG. 7A is a top view of a scan of a current layer of a subject wafer 701 in accordance with an aspect of the present invention. The subject wafer 701 has a circular shape and is comprised of a semiconductor material. The subject wafer 701 includes a plurality of semiconductor dies 702 wherein semiconductor devices according to a particular semiconductor design are fabricated. The devices are at a particular stage of fabrications, such as metallization, and have been scanned to identify possible defects at various locations of the wafer 701.

The scan of the current layer identifies possible defects as shown in FIG. 7A at 706, 708, 712, 714, and 716. Conventional analysis would merely look at special locations within the dies 702 to identify spatial repeaters within the wafer 701. However, the present invention and the method 600 of FIG. 6 compare these defects with a wafer or layer map of a master wafer corresponding to the currently scanned layer of the wafer 701. From this comparison, repetitive defects, spatial or non-spatial, can be identified. FIGS. 5B and 5C, described above, depict an exemplary die map and wafer map that can be employed to identify repetitive defects.

FIG. 7B is a view illustrating matching defects of the wafer 701 with the exemplary wafer map of FIG. 5C and die map of FIG. 5B in accordance with an aspect of the present invention. Here, the defects 706, 708, 712 match a number of repeaters 506, 508, and 512 of the die map and are, therefore, matching repeaters or matching repetitive defects. The defects 714 and 716 are non-matching and are deemed as non-repetitive defects, which are more likely innocuous defects. However, the non-matching defects can be added to the die map and, therefore the wafer or layer map in order to update the master wafer map.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of generating a wafer map, the method comprising:
   selecting a layer of a semiconductor design for analysis;
   combining defect histories for a plurality of wafers of the selected layer;
   analyzing the defect histories to identify repetitive defects for the selected layer;
   forming a single die map comprised of the identified repetitive defects; and
   generating the wafer map for the selected layer from the single die map, wherein generating the wafer map comprises replicating the formed single die map a number of times.

2. The method of claim 1, wherein selecting the layer of the semiconductor design for analysis comprises identifying a critical process stage and selecting the layer at the identified critical process stage.

3. The method of claim 2, wherein the identified critical process stages is an etch.

4. The method of claim 1, wherein combining the defect histories comprises creating a database and inserting the defect histories as entries.

5. The method of claim 4, wherein the entries include spatial information.

6. The method of claim 4, wherein the entries include additional information.

7. The method of claim 1, wherein analyzing the defect histories for the selected layer comprises comparing spatial information of defects within the defect histories.

8. The method of claim 1, wherein analyzing the defect histories for the selected layer to identify the repetitive defects comprises identifying defect locations that have more than a threshold number of defects occurring there at.

9. The method of claim 1, wherein the wherein the repetitive defects include spatially repetitive and structural repetitive defects.

10. The method of claim 1, further comprising combining the wafer map with additional wafer maps for additional layers of the design into a master wafer.

11. The method of claim 1, further comprising:
   selecting a second layer of a semiconductor design for analysis;
   combining defect histories for a plurality of wafers of the second selected layer;
   analyzing the defect histories to identify repetitive defects for the second selected layer;
   forming a second die map comprised of the identified repetitive defects for the second selected layer;
   generating a second wafer map for the selected layer from the second die map; and
   combining the second wafer map with the wafer map into a master wafer.

12. A method of identifying defects in semiconductor devices, the method comprising:

providing a subject wafer having dies with semiconductor devices formed therein according to a semiconductor design;

scanning the subject wafer at a selected stage of fabrication to obtain a scanned layer of a current layer, wherein the scanned layer identifies defects and defect locations within individual die on the subject wafer;

obtaining a wafer map from a master wafer; and comparing the scanned layer with the wafer map to identify matching defects.

13. The method of claim 12, further comprising reviewing the matching defects.

14. The method of claim 13, wherein reviewing the matching defects comprises analyzing and classifying the repetitive defects into one or more categories of similar shapes.

15. The method of claim 12, wherein scanning the subject wafer comprises performing optical scanning of the dies, individually.

16. The method of claim 12, further comprising updating the wafer map with the identified defects.

17. A method of identifying defects in semiconductor devices, the method comprising:

providing a subject wafer having dies with semiconductor devices formed therein according to a semiconductor design;

scanning the subject wafer at a selected stage of fabrication to obtain a scanned layer of a current layer, wherein the scanned layer identifies defects and locations;

obtaining a wafer map from a master wafer;

comparing the scanned layer with the wafer map to identify matching defects; and reviewing the matching defects, wherein reviewing the matching defects further comprises comparing the matching defects with an inspected underlayer and an inspected overlayer to facilitate classifying the matching defects.

18. A method of identifying repetitive defects in semiconductor devices, the method comprising:

providing a semiconductor design having a plurality of layers;

selecting a stage of fabrication for analysis;

selecting a layer of the plurality of layers according to the selected stage of fabrication;

combining defect histories for a plurality of wafers of the semiconductor design for the selected layer;

analyzing the defect histories to identify repetitive defects for the selected layer;

forming a die map for the selected layer from the identified repetitive defects that comprises the identified repetitive defects at defect locations;

generating a wafer map for the selected layer by replicating the die map a number of times;

scanning a current layer of a wafer having devices at the selected stage of fabrication to obtain a scanned layer;

comparing the scanned layer with the wafer map to identify matching defects; and reviewing the identified matching defects.

19. The method of claim 18, wherein selecting a stage of fabrication comprises selecting a critical stage of fabrication.

20. The method of claim 18, further comprising updating the wafer map with non-matching defects.

21. The method of claim 20, further comprising updating a master wafer with the updated wafer map.

\* \* \* \* \*